(12) United States Patent
Hsu

(10) Patent No.: US 9,426,917 B2
(45) Date of Patent: Aug. 23, 2016

(54) SOCKET ASSEMBLY WITH PICK UP CAP

(71) Applicant: FOXCONN INTERCONNECT TECHNOLOGY LIMITED, Grand Cayman (KY)

(72) Inventor: Shuo-Hsiu Hsu, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 14/619,088

(22) Filed: Feb. 11, 2015

(65) Prior Publication Data

US 2015/0229063 A1    Aug. 13, 2015

(30) Foreign Application Priority Data

Feb. 11, 2014   (TW) .............................. 103104330 A

(51) Int. Cl.
*H01R 13/44* (2006.01)
*H05K 7/10* (2006.01)

(52) U.S. Cl.
CPC .................................. *H05K 7/1061* (2013.01)

(58) Field of Classification Search
CPC .............................. H01R 13/447; H01R 13/44
USPC .......................................... 439/136, 940, 41
See application file for complete search history.

(56) References Cited

U.S. PATENT DOCUMENTS

| | | | | |
|---|---|---|---|---|
| 6,626,691 B2 * | 9/2003 | Yu | ......................... | H05K 7/1007 439/135 |
| 6,877,990 B2 * | 4/2005 | Liao | ....................... | H01R 12/88 439/41 |
| 7,402,065 B1 * | 7/2008 | Polnyi | ................ | H01R 12/7029 411/531 |
| 7,517,229 B2 * | 4/2009 | Ma | ....................... | H05K 7/1061 439/331 |
| 7,588,453 B2 * | 9/2009 | Ma | ....................... | H05K 7/1007 439/342 |
| 7,866,985 B2 * | 1/2011 | Hsu | ...................... | H05K 7/1061 439/135 |
| 8,142,201 B2 * | 3/2012 | Fan | ...................... | H05K 7/1007 439/135 |
| 8,257,098 B2 * | 9/2012 | Yeh | ...................... | H05K 7/1053 439/135 |
| 8,353,708 B2 * | 1/2013 | Hsu | ...................... | H05K 7/1007 439/67 |
| 8,425,245 B2 * | 4/2013 | Tsai | ....................... | H01R 12/88 248/371 |
| 8,439,693 B2 * | 5/2013 | Yeh | ...................... | H05K 7/1007 439/135 |
| 8,550,826 B2 * | 10/2013 | Hsu | ...................... | H05K 7/1015 439/73 |
| 8,998,623 B2 * | 4/2015 | Hsu | ...................... | H05K 7/1053 439/70 |
| 9,131,613 B2 * | 9/2015 | Hsu | ...................... | H05K 7/1007 |
| 9,214,764 B2 * | 12/2015 | Hsu | ...................... | H01R 13/645 |
| 2013/0029506 A1 * | 1/2013 | Zhou | .................... | G01R 1/0466 439/136 |
| 2015/0229063 A1 * | 8/2015 | Hsu | ...................... | H05K 7/1061 439/136 |

FOREIGN PATENT DOCUMENTS

TW         M532592         5/2003
TW    399879 097111376    6/2013

* cited by examiner

*Primary Examiner* — Abdullah Riyami
*Assistant Examiner* — Nader J Alhawamdeh
(74) *Attorney, Agent, or Firm* — Wei Te Chung; Ming Chieh Chang

(57) ABSTRACT

A socket assembly, adapted for connecting IC package to a printed circuit board, comprises an insulative housing, a plurality of conductive contacts received in the insulative housing; and a pick up cap covering the insulative housing. The pick up cap has a position unit and a moving unit assembled to the position unit. The moving unit is movable relative to the position unit in a horizontal direction. The moving unit has a plurality of latch latching the insulative housing to retain the pick up cap to the insulative housing when the moving unit slides.

17 Claims, 7 Drawing Sheets

SOCKET ASSEMBLY WITH PICK UP CAP

BACKGROUND OF THE INVENTION

1. Field of the Invention

The present invention relates to sockets, more particularly to an socket with pick up cap.

2. Description of Related Art

Sockets are widely used in electronic field, such as computer. A socket for connecting an IC package to a printed circuit board, comprises an insulative housing and a plurality of contacts received in the insulative housing. Usually, a pick up cap is attached to the socket to cover the insulative hosing, the pick up cap can be sucked to move the socket conveniently and also protect the contacts from dust dropping into the socket. In related technology, the pick up cap has a latching claw downwardly extending, and the latching claw interferes with the insulative housing so as to retain the pick up cap to the insulative housing. When remove the pick up cap, downwardly press the pick up cap, the latching claw distorts and releases the insulative housing and then be removed.

However, the pick up cap is directly assembled to the insulative housing in a top to bottom direction, the contacts may be crushed by the pick up cap during an improper operation, and a large force is needed to put on/take off the pick up cap from the insulative housing.

Hence, an improved socket assembly is desired to overcome the above problems.

BRIEF SUMMARY OF THE INVENTION

According to one aspect of the present invention, a socket assembly, adapted for connecting IC package to a printed circuit board, comprises a socket and a pick up cap. The socket is formed with an insulative housing and a plurality of conductive contacts received in the insulative housing. The pick up cap covers the insulative housing, and has a position unit and a moving unit assembled to the position unit. The moving unit is movable relative to the position unit in a horizontal direction, and has a plurality of latches, the latch latches with the insulative housing to retain the pick up cap to the insulative housing when sliding the moving unit.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
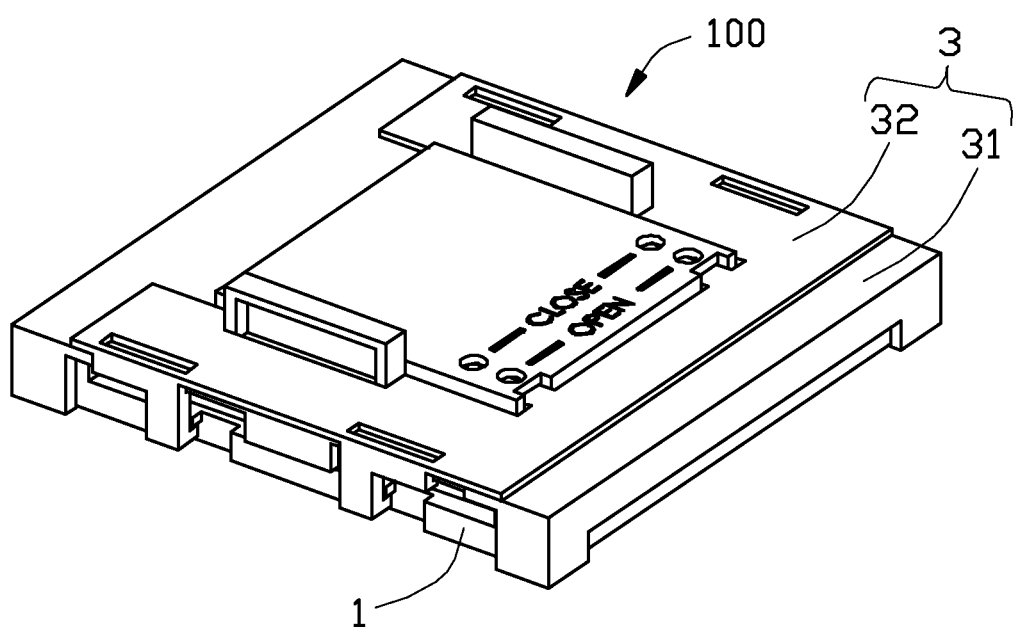
FIG. 1 is an assembled, perspective view of a socket assembly according to the present invention.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Reference will be made to the drawing figures to describe the present invention in detail, wherein depicted elements are not necessarily shown to scale and wherein like or similar elements are designated by same or similar reference numeral through the several views and same or similar terminology.

Figure 2:
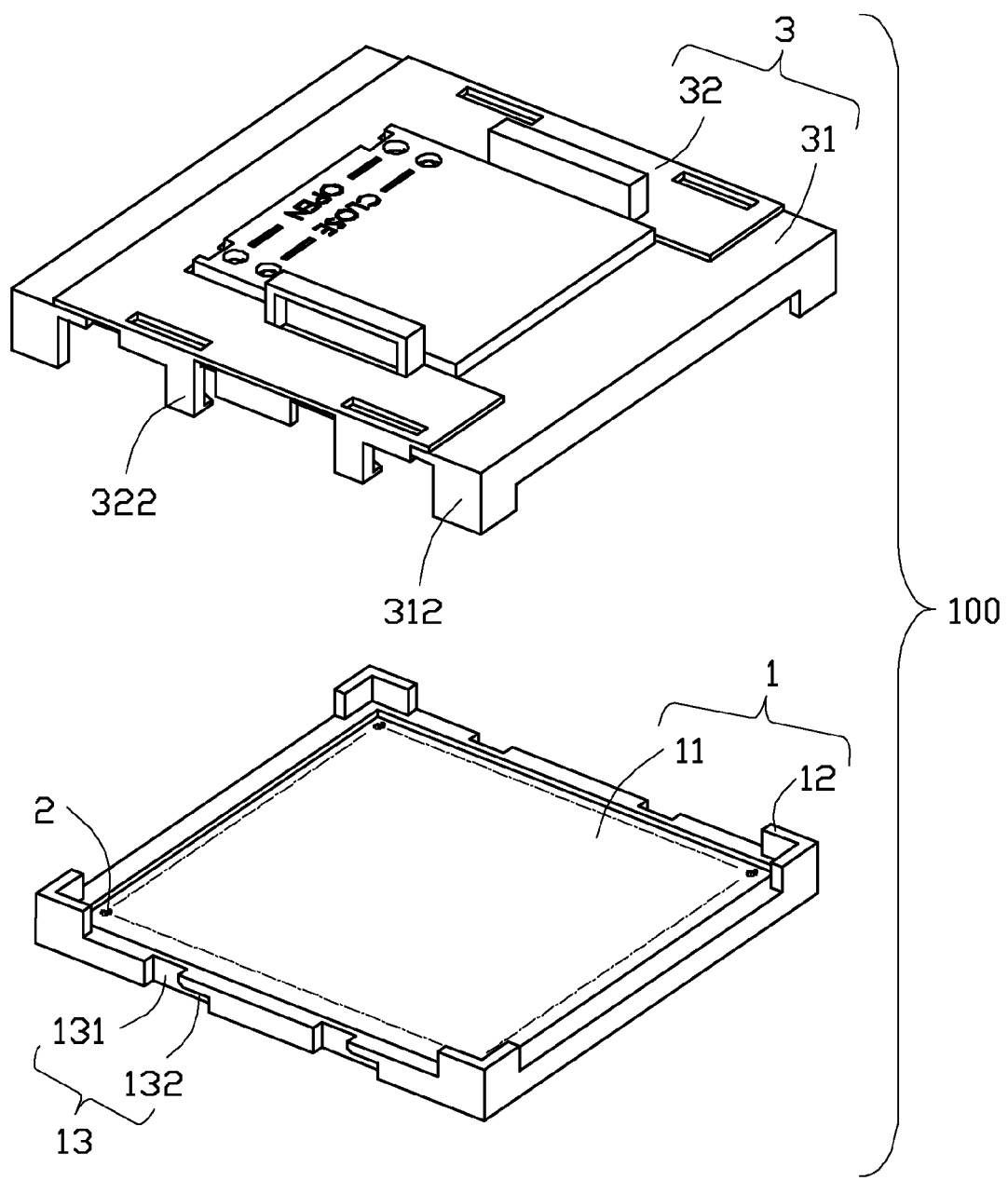
FIG. 2 is another perspective view of the socket assembly, wherein a pick up cap is detached from an insulative housing.

Referring to FIGS. 1-2, a socket assembly 100 in accordance with present invention is used for electrically connecting an IC package to a printed circuit board. The socket assembly 100 comprises a socket and a pick up cap 3 assembled to the socket. The socket comprises an insulative housing 1 and a plurality of conductive contacts 2 retained in the insulative housing 1.

Figure 3:
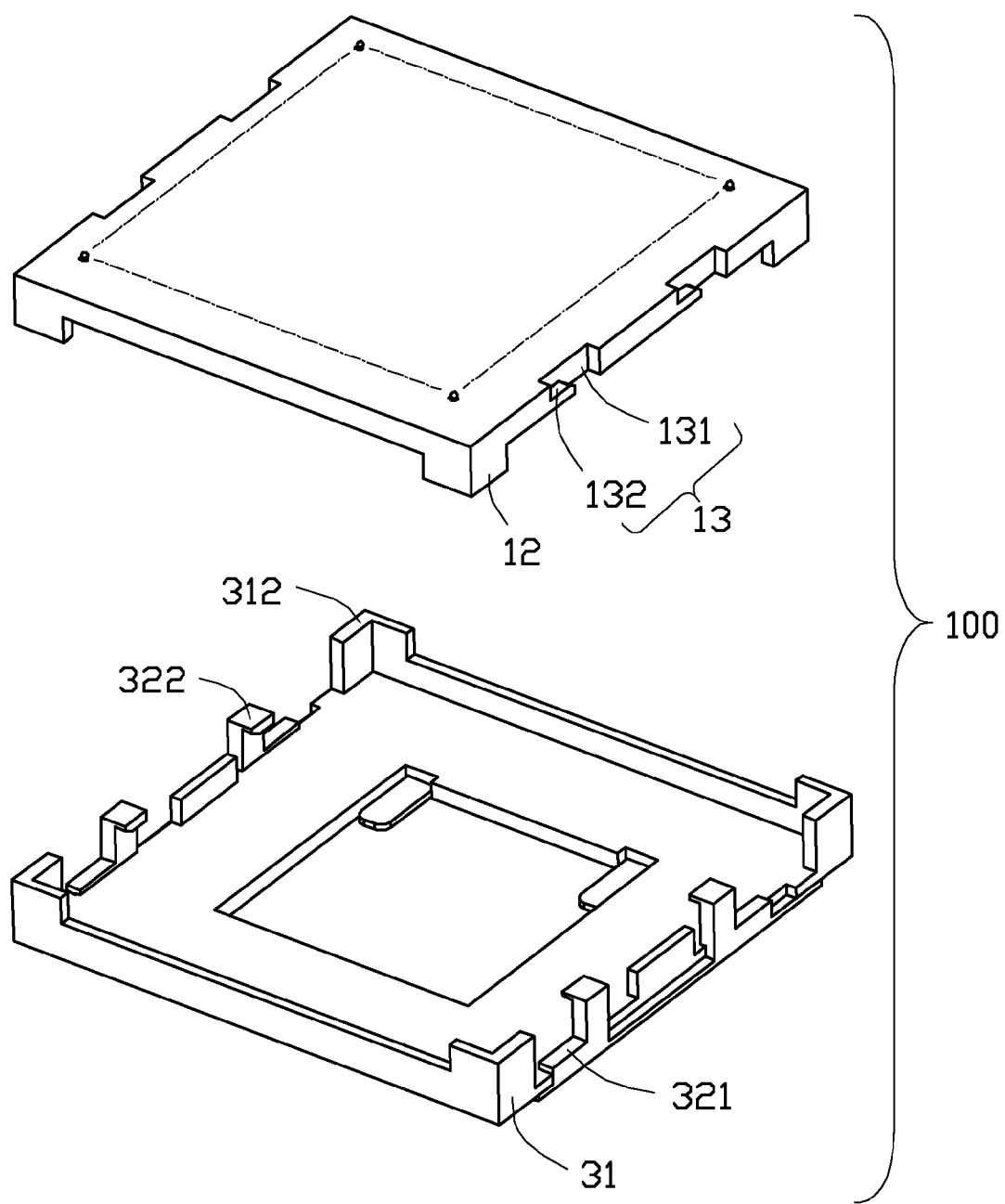
FIG. 3 is another perspective view of the socket assembly in FIG. 2, taken from another side.

Referring to FIGS. 2-3, the insulative housing 1 has a rectangular configuration, and comprises a bottom wall 11 and sidewalls 12 upwardly extending from the bottom wall 11, these walls 11, 12 together define a receiving space for the IC package. The conductive contacts 2 are received in the bottom wall 11 and extend into the receiving space to contact with the IC package. The insulative housing 11 defines two slots 13 on two opposite sides of the bottom wall 11 thereof, each slot 13 is recessed from an outer surface of the bottom wall 11 and passes through the bottom wall 11 in a top to bottom direction, the slots 13 has a first slot 131 upwardly extending through the bottom wall 11 and a second slot 132 communicating with the first slot 131. The second slot 132 communicates a lower part of the first slot 131, so that the slot 13 wholly has an L configuration.

Figure 4:
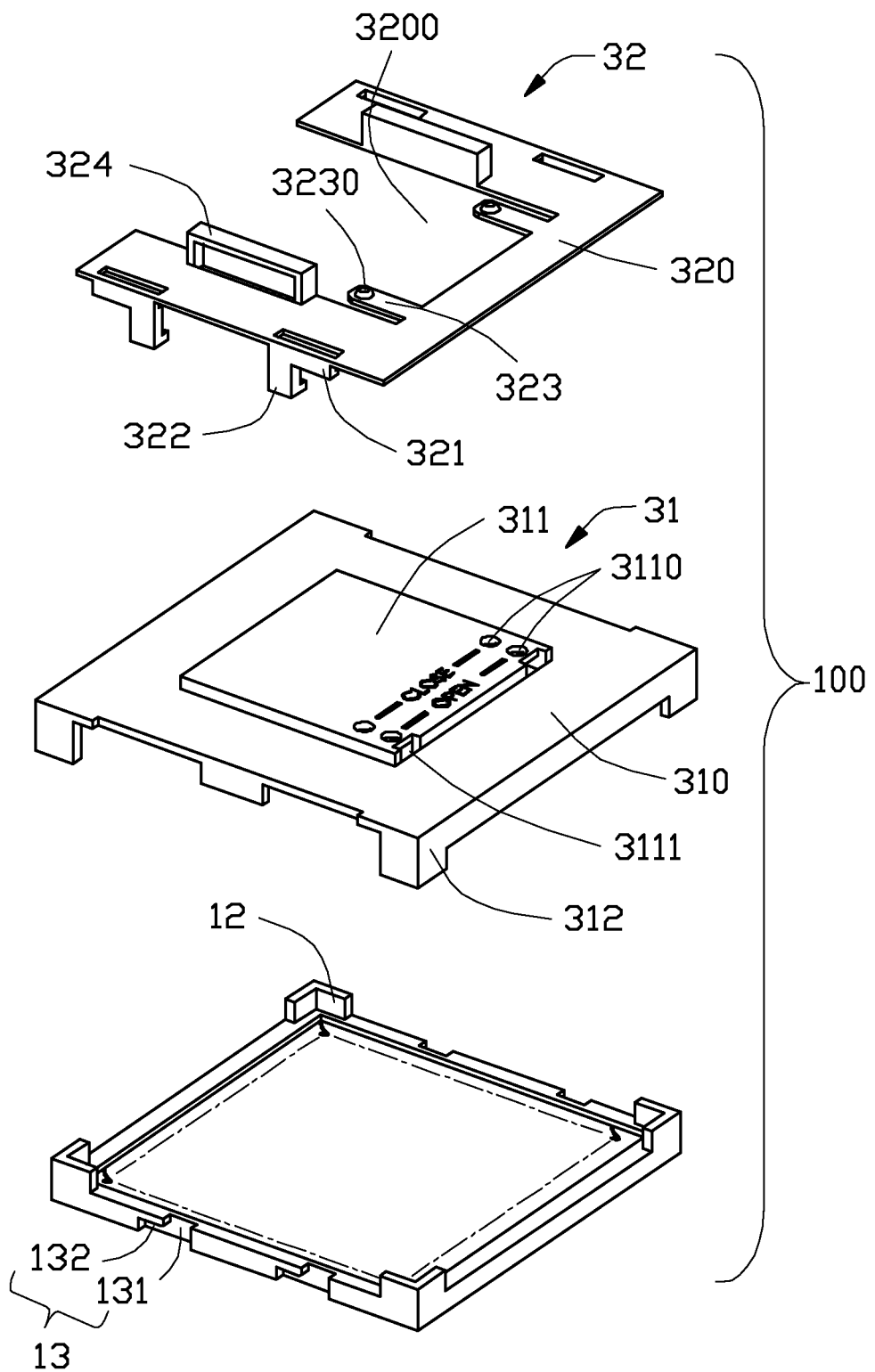
FIG. 4 is an exploded, perspective view of the socket assembly according to the present invention.
Figure 5:
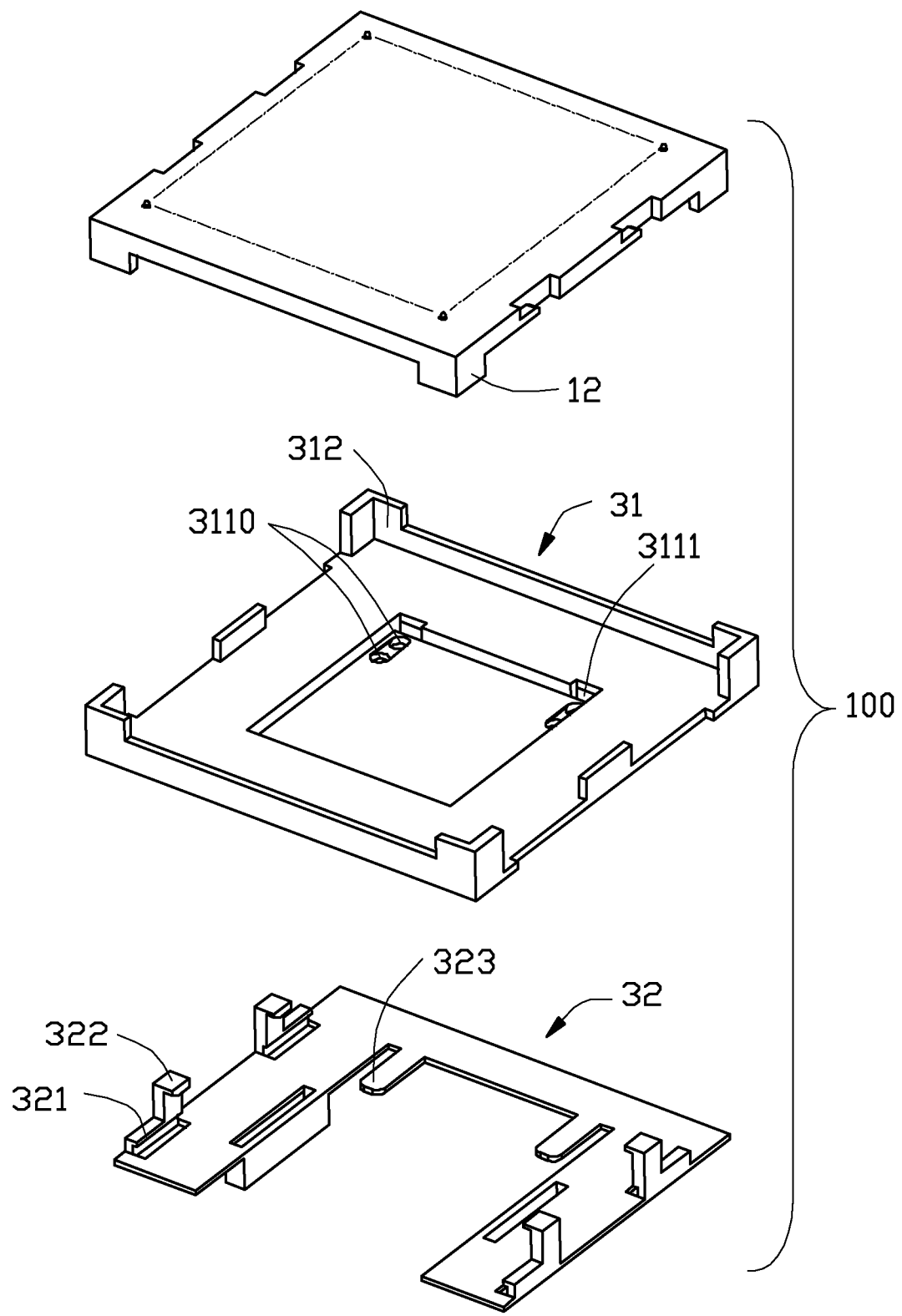
FIG. 5 is another exploded, perspective view of the socket assembly in FIG. 4.

Referring to FIGS. 4 and 5, the pick up cap 3 has a position unit 31 and a moving unit 32 assembled on the position unit 31. The position unit 31 has a rectangular shape, and comprises a top wall 310 disposed on a horizontally plane and a plurality of block walls 312 downwardly extending from the top wall 310. The block walls 312 engage with the sidewalls 12 of the insulative housing 1 to position the pick up cap 3 on the insulative housing 1. In present embodiment, the block wall 32 is located outside the sidewall 12 of the insulative housing 1 to limit a movement of the pick up cap 3 in a horizontal direction. The position unit 31 has a protruding portion 311 upwardly protruding from a center of the top wall 310, which has a smooth surface for being sucked by vacuum sucker (not shown). The protruding portion 311 has a plurality of recesses 3110 for indicating an "open" or "closed" state. The recesses 3110 are divided into two rows, a front row is aligned with a "CLOSE" label, and a rear row is aligned with an "OPEN" label. The moving unit 32 has indication structures to engage with the recesses 3110. Two though holes 3111 are defined on a side wall of the protruding portion 311 to allow the indication structure of the moving unit 32 to pass through and move between an open position and a closed position.

The moving unit 32 is a U-shape frame with three sides and an opening 3200 for receiving the protruding portion 311. The moving unit 32 has a frame 320 on a horizontally plane, a plurality of sliding slots 321 and a plurality of sliding latches 322 extending downwardly from the frame 320. The sliding slot 321 is higher than the sliding latch 322, the sliding slot 321 engages with an edge of the top wall 310 of the position unit 31 so as to movably assemble the moving unit 32 to the position unit 31, the sliding latch 322 engages with the slots 13 of the insulative housing 1. The moving unit 32 further has two protruding pieces 323 extending from the frame 320 into the opening 3200 and passing through the through holes 3111 of the position unit 31 to be under the recesses 3110. A protrusion 3230 is formed on a free end of the protruding piece 323, the protrusion 3230 is the indication structure described above, which can be seen from the recess 3110. The moving unit 32 further has a pair of pressing portions 324 upwardly extending from the frame 320 to be handled when moving the pick up cap 3.

An assembly process of the socket assembly 100 is: firstly, assemble the moving unit 32 and the position unit 31 together, the flame 320 of the moving unit 32 is set upon the top wall 310 of the position unit 31, the sliding slots 321 of the moving unit 32 receive the edges of the top wall 310 of the position unit 31 and guide the moving unit 32 horizontally sliding relative to the position unit 31, the protruding pieces 323 pass through the through hole 3111 of the position unit 31, and make the protrusion 3230 of the protruding piece 323 engage with the recess 3110 aligned with the label "OPEN"; then put the assembled pick up cap 3 on the insulative housing 1, the block wall 312 of the position unit 31 of the pick up cap 3 is against an outside of the sidewall 12 of the insulative housing 1, so that the pick up cap 3 is positioned to the insulative housing 1 in the horizontally direction, the sliding latch 322 of the moving unit 32 enters into the first slot 131 of the slot 13 of the insulative housing 1; finally, push the moving unit 32 to horizontally slide relative to the position unit 31, the sliding latch 322 slides from the first slot 131 to the second slot 132 and interferes with the insulative housing 1, and correspondingly, the protrusion 3230 slides to the recess 3110 aligned with the label "CLOSE", the pick up cap 3 is assembled to the insulative housing 1 completely. When need to remove the pick up cap 3, slide the moving unit 32 toward an opposite direction relative to the position unit 31, the sliding latch 322 slides from the second slot 132 to the first slot 131 and release the interference with the insulative housing 1, the protrusion 3230 slides to the recess 3110 aligned with the label "OEPN" again, the pick up cap 3 is now can be picked away from the insulative housing 1 via the pressing portions 324.

Figure 6:
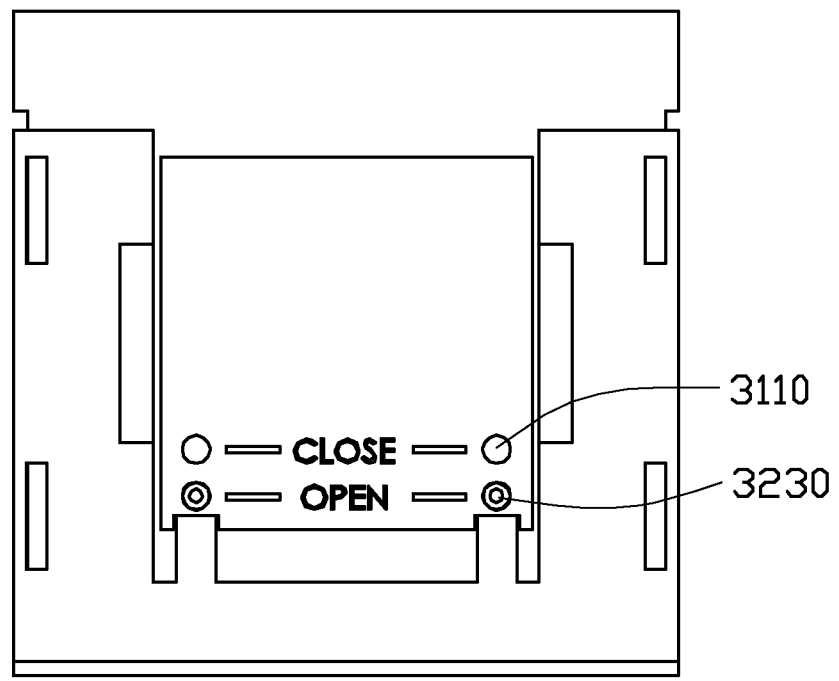
FIG. 6 is a top view of the socket assembly in a open state.
Figure 7:
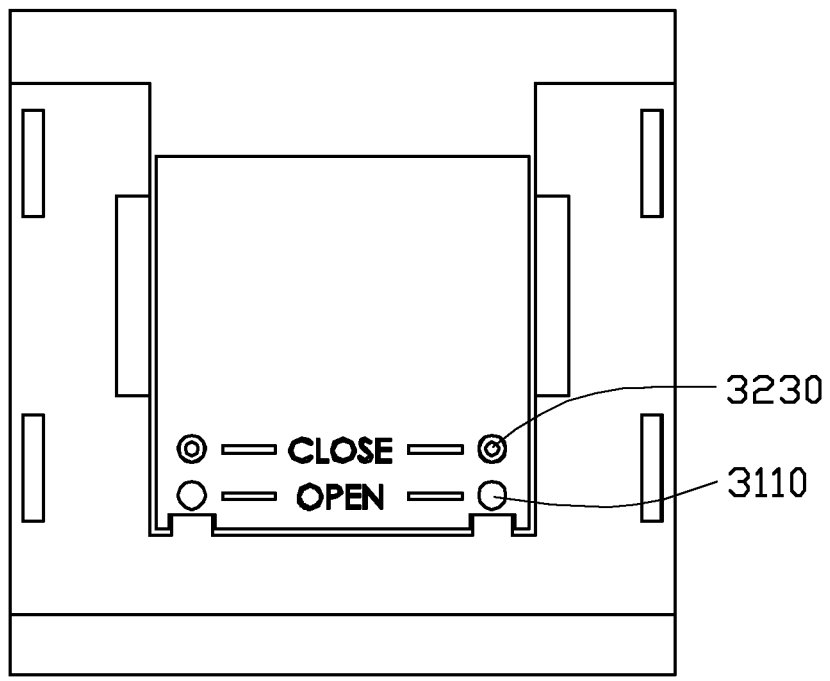
FIG. 7 is a top view of the socket assembly in a closed state.

Referring to FIGS. 6 and 7, the recesses 3110 of the position unit 31 and the protrusions 3230 of the moving unit 32 engage with each other to indicate an state of the pick up cap 3 relative to the insulative housing 1, the protrusions 3230 and recesses 3110 elastically interfere, so that an operation handle can be obtained when the moving unit 32 slides to a right position. In other embodiment, another indication structures can be used, they may interfere with each other, or there is no interference but only be labeled.

The pick up cap 3 comprises the position unit 31 and the moving unit 32, the position unit 31 has block wall 312 to position the insulative housing 1 to prevent the pick up cap 3 from crushing the conductive contacts 2 during mounting the pick up cap 3 to the insulative housing 1. The vacuum sucker sucks the position unit 31 to prevent the pick up cap 3 from dropping from the insulative housing 1 when the moving unit 32 horizontally slides. The sliding latch 322 of the moving unit 32 is located in the first slot 131 at the open position, and does not interferes with the insulative housing 1, so it is easy to remove the pick up cap 3. And indication structures are provided to ensure that an operator know the pick up cap 3's position relative to the insulative housing 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed. For example, instead of moving in a horizontal direction between opposite open and locked positions, the moving unit may be moved relative to the position unit in a rotational or translational manner.

I claim:

1. A socket assembly, adapted for connecting IC package to a printed circuit board, comprises:
   a socket, the socket formed with an insulative housing, and a plurality of conductive contacts received in the insulative housing; and
   a pick up cap covering the insulative housing, the pick up cap having a position unit and a moving unit assembled to the position unit, the moving unit movable relative to the position unit from an open position to a closed, and having a plurality of latches, the sliding latch latching with the insulative housing to retain the pick up cap to the insulative housing when the moving unit is moved from the open position to the closed position; wherein said moving unit is moveable along a horizontal direction relative to the position unit.

2. The socket assembly as claimed in claim 1, wherein the insulative housing has a slot in which the sliding latch slides when the moving unit slides relative to the position unit, the slot is formed with a first slot and a second slot communicating with the first slot in the horizontal direction, when the latch is located in the first slot, the pick up cap can be upwardly picked up from the insulative housing, and when the sliding latch is located in the second slot, the pick up cap is retained to the insulative housing.

3. The socket assembly as claimed in claim 2, wherein the position unit is fasten relative to the insulative housing in the horizontal direction.

4. The socket assembly as claimed in claim 3, wherein the insulative housing has a plurality of sidewalls, the position unit has block walls outside the sidewalls.

5. The socket assembly as claimed in claim 1, wherein the position unit has a protruding portion on a center thereof and with a smooth surface for being sucked.

6. The socket assembly as claimed in claim 5, wherein the position unit has a top wall, the moving unit has a frame engaging with the top wall, the top wall and the frame have indication structures to show a state of the pick up cap relative to the insulative housing.

7. The socket assembly as claimed in claim 6, wherein the indication structures on the position unit is a recess, and the moving unit has a protruding piece extending to a lower side of the recess, the indication structure on the moving unit is a protrusion disposed on the protruding piece and can be set under the recess to be seen.

8. The socket assembly as claimed in claim 6, wherein the moving unit further has a pair of pressing portions upwardly extending from the frame to be handled when moving the pick up cap.

9. A pick up cap, adapted for use with a socket, comprises: a position unit with an exposed smooth surface; and a moving unit assembled to the position unit, the moving unit movable relative to the position unit from an open position to a closed position, the moving unit having a plurality of sliding latch downwardly extending for latching with the socket; wherein the moving unit is moveable along a horizontal direction from the said open position to the closed position.

10. The pick up cap as claimed in claim 9, wherein the position unit has a top wall and a plurality block walls extending downwardly from the top wall.

11. The pick up cap as claimed in claim 9, wherein the position unit has a top wall, the moving unit has a frame engaging with the top wall, the top wall and the frame have indication structures to show a state of the pick up cap relative to the socket.

12. The pick up cap as claimed in claim 11, wherein the moving unit has a plurality of sliding slots engaging with an edge of the top wall of the position unit so as to movably assemble the moving unit to the position unit.

13. The pick up cap as claimed in claim 11, wherein the indication structure on the position unit is a recess, and the moving unit has a protruding piece with a protrusion, the protruding piece follows the moving unit to move and brings the protrusion to be under the recess to be seen from a top side.

14. The pick up cap as claimed in claim 12, wherein the moving unit further has a pair of pressing portions upwardly extending from the frame to be handled when moving the pick up cap.

15. A method of assembling a pick-up cap upon an electrical connector comprising steps of: providing the electrical connector with an insulative housing defining an upward receiving space therein, and with a plurality of conductive contacts disposed within the housing with corresponding contacting sections upwardly extending into the receiving space;
providing the pick-up cap with a positioning unit and a moving unit associated with each other wherein said moving unit is moveable relative to the positioning unit; and
downwardly positioning the positioning unit upon the housing in a vertical direction to cover the receiving space initially, and moving the moving unit from an open position to a locked position to lock with the housing; wherein said moving unit is moveable between the open position and the closed position in a horizontal direction perpendicular to said vertical direction.

16. The method as claimed in claim 15, wherein one of the positioning unit and the moving unit includes a protruding piece extending along the horizontal direction, and the other includes a corresponding hole receiving said protruding piece so as to regulate the moving unit to move in said horizontal direction between said open position and said closed position.

17. The method as claimed in claim 16, wherein one of the moving unit and said housing includes a sliding latch extending along the vertical direction, and the other includes a slot to have said sliding latch engaged therein.

* * * * *